(12) United States Patent
Ong et al.

(10) Patent No.: US 6,657,914 B1
(45) Date of Patent: Dec. 2, 2003

(54) CONFIGURABLE ADDRESSING FOR MULTIPLE CHIPS IN A PACKAGE

(75) Inventors: Adrian E. Ong, Pleasanton, CA (US); Fan Ho, San Ramon, CA (US)

(73) Assignee: Inapac Technology, Inc., San Jose, CA (US)

( * ) Notice: Subject to any disclaimer, the term of this patent is extended or adjusted under 35 U.S.C. 154(b) by 0 days.

(21) Appl. No.: 09/909,675

(22) Filed: Jul. 19, 2001

(51) Int. Cl.[7] ................................................. G11C 8/00
(52) U.S. Cl. ............................. 365/230.06; 365/230.08
(58) Field of Search ....................... 365/230.06, 230.01, 365/230.08; 711/5, 191, 200, 202, 225.7

(56) References Cited

U.S. PATENT DOCUMENTS

| | | | | |
|---|---|---|---|---|
| 4,309,754 A | * | 1/1982 | Dinwiddie, Jr. | ............. 710/307 |
| 5,031,139 A | * | 7/1991 | Sinclair | ....................... 712/18 |
| 5,862,148 A | * | 1/1999 | Typaldos et al. | ............. 714/39 |
| 6,021,459 A | * | 2/2000 | Norman et al. | ........ 365/230.03 |

* cited by examiner

*Primary Examiner*—Thong Le
(74) *Attorney, Agent, or Firm*—Sidley Austin Brown & Wood LLP (57) ABSTRACT

A first semiconductor chip is provided. The first semiconductor chip is operable to be incorporated along with at least a second semiconductor chip of the same type into an integrated circuit device within in a single package. The integrated circuit device has a common address path for the first and second semiconductor chips. The first semiconductor chip includes a configurable addressing circuit operable to be configured so that the first semiconductor chip responds to a predetermined range of addresses in the common address path of the integrated circuit device, to decode an address conveyed in the common address path of the integrated circuit device, and to generate a selection signal if the address conveyed in the common address path falls within the predetermined range of addresses.

32 Claims, 6 Drawing Sheets

CONFIGURABLE ADDRESSING FOR MULTIPLE CHIPS IN A PACKAGE

FIELD OF THE INVENTION

The present invention relates to integrated circuit (IC) devices, and in particular, configurable addressing for multiple chips in a package.

BACKGROUND OF THE INVENTION

In the field of integrated circuit (IC) devices, several semiconductor die (commonly referred to as "chips") can be combined into a single protective package. For some applications, a plurality of the chips put into a single package can be the same type, such as, for example, memory or logic. This allows for increased functional capacity using readily available chips.

For integrated circuit devices having multiple chips of the same type in one package, it may be desirable during operation to access a specific one of such chips within the package for inputting or retrieving data/information. With previously developed techniques, a specific chip is accessed using one or more chip select signals, which select the desired chip. Such previously developed techniques, however, can be problematic. A user of a multiple-chip integrated circuit device must generate the chip select signal, either by programming or hardwiring electronic components which interface with the integrated circuit device. Furthermore, provision must be made to keep track of which information/data is or should be input or retrieved from which chip in the device. Also, the functional elements (e.g., logic or memory) on the separate chips cannot be viewed as a uniform group of elements, which are accessible as a whole. Rather, the elements on a first chip must be considered and treated as a first group, the elements on a second chip must be considered and treated as a second group, and so on. This complicates the use of and interaction with the multiple-chip integrated circuit device.

SUMMARY OF THE INVENTION

The disadvantages and problems associated with previously developed schemes and techniques for accessing multiple chips of the same kind in a single package have been substantially reduced or eliminated using the present invention.

In accordance with an embodiment of the present invention, a first semiconductor chip is provided which is operable to be incorporated along with at least a second semiconductor chip of the same type into an integrated circuit device within a single package. The integrated circuit device has a common address path for the first and second semiconductor chips. The first semiconductor chip includes an option logic circuit operable to generate a configuration signal for causing an address decode circuit to respond to a predetermined range of addresses conveyed in the common address path of the integrated circuit device. The address decode circuit is in communication with the option logic circuit. The address decode circuit is operable to decode an address conveyed in the common address path of the integrated circuit device using the configuration signal and to generate a selection signal for selecting the first semiconductor chip if the address falls within the predetermined range of addresses.

In accordance with another embodiment of the present invention, a method is provided for configurable addressing of a first semiconductor chip incorporated along with at least a second semiconductor chip of the same type into an integrated circuit device within a single package. The integrated circuit device has a common address path for the first and second semiconductor chips. The method includes: generating a configuration signal for causing the first semiconductor chip to respond to a predetermined range of addresses conveyed in the common address path of the integrated circuit device; and generating a selection signal for selecting the first semiconductor chip if an address conveyed in the common address path of the integrated circuit device falls within the predetermined range of addresses.

In accordance with yet another embodiment of the present invention, an integrated circuit device having a common address path is provided. The integrated circuit device includes a multi-chip module substrate. A plurality of semiconductor chips of the same type are attached to the multi-chip module substrate. Each semiconductor chip comprises a respective configurable addressing circuit for causing the semiconductor chip to respond to a respective predetermined range of addresses, wherein each semiconductor chip is selected by an address conveyed in the common address path of the integrated circuit device if the address falls within the respective predetermined range of addresses for the semiconductor chip In accordance with still another embodiment of the present invention, an integrated circuit device includes a multi-chip module substrate. A plurality of semiconductor chips of the same type are attached to the multi-chip module substrate. A common address path is provided for the plurality of semiconductor chips. Each semiconductor chip comprises a respective plurality of functional elements, each functional element separately addressable by a respective address. Each semiconductor chip also includes a respective configurable addressing circuit for causing the semiconductor chip to respond to any address within a respective predetermined range of addresses. This respective predetermined range of may comprise the respective addresses for each functional element of the semiconductor chip, wherein said any address within the respective predetermined range of addresses is conveyed in the common address path of the integrated circuit device.

In accordance with another embodiment of the present invention, an integrated circuit device includes a multi-chip module substrate. A plurality of semiconductor chips of the same type can be attached to the multi-chip module substrate. A common address path for the plurality of semiconductor chips is provided. Each semiconductor chip may comprise a respective plurality of functional elements and respective configurable addressing circuit. Each functional element can be separately addressable by a respective address. The respective configurable addressing circuits cause the semiconductor chip to respond to any address within a respective predetermined range of addresses. The respective predetermined range of addresses comprises the respective address for each functional element of the semiconductor chip, wherein said any address within the respective predetermined range of addresses is conveyed in the common address path of the integrated circuit device.

In accordance with still yet another embodiment of the present invention, a decode circuit is provided for a first semiconductor chip which is operable to be incorporated along with at least a second semiconductor chip of the same type into an integrated circuit device within a single package. The integrated circuit device has a common address path for the first and second semiconductor chips. The decode circuit is operable to generate a selection signal for selecting the first semiconductor chip if an address conveyed in the common address path falls within a predetermined range of addresses.

In accordance with yet another embodiment of the present invention, an option logic circuit is provided for a first semiconductor chip operable to be incorporated along with at least a second semiconductor chip of the same type into an integrated circuit device within a single package. The integrated circuit device has a common address path for the first and second semiconductor chips. The option logic circuit is operable to be configured so that the first semiconductor chip responds to a predetermined range of addresses conveyed in the common address path of the integrated circuit device. The option logic circuit is operable to generate a configuration signal for causing the first semiconductor chip to be selected if an address conveyed in the common address path falls within the predetermined range of addresses.

In accordance with yet another embodiment of the present invention, a first semiconductor chip is provided. The first semiconductor chip is operable to be incorporated along with at least a second semiconductor chip of the same type into an integrated circuit device within in a single package. The integrated circuit device has a common address path for the first and second semiconductor chips. The first semiconductor chip includes a configurable addressing circuit operable to be configured so that the first semiconductor chip responds to a predetermined range of addresses in the common address path of the integrated circuit device, to decode an address conveyed in the common address path of the integrated circuit device, and to generate a selection signal if the address conveyed in the common address path falls within the predetermined range of addresses.

In accordance with another embodiment of the present invention, a method is provided for configurable addressing of a first semiconductor chip incorporated along with at least a second semiconductor chip of the same type into an integrated circuit device within a single package. The integrated circuit device has a common address path for the first and second semiconductor chips. The method comprises: configuring the first semiconductor chip to respond to a predetermined range of addresses in the common address path of the integrated circuit device; decoding an address conveyed in the common address path of the integrated circuit device; and generating a selection signal if the address conveyed in the common address path falls within the predetermined range of addresses.

Important technical advantages of the present invention are readily apparent to one skilled in the art from the following figures, descriptions, and claims.

BRIEF DESCRIPTION OF THE DRAWINGS

For more complete understanding of the present invention and for further features and advantages, reference is now made to the following description taken in conjunction with the accompanying drawings, in which.

DETAILED DESCRIPTION OF THE PREFERRED EMBODIMENTS

The preferred embodiments of the present invention and their advantages are best understood by referring to FIGS. 1 through 8 of the drawings. Like numerals are used for like and corresponding parts of the various drawings.

Multiple Chips in a Package

Figure 1:
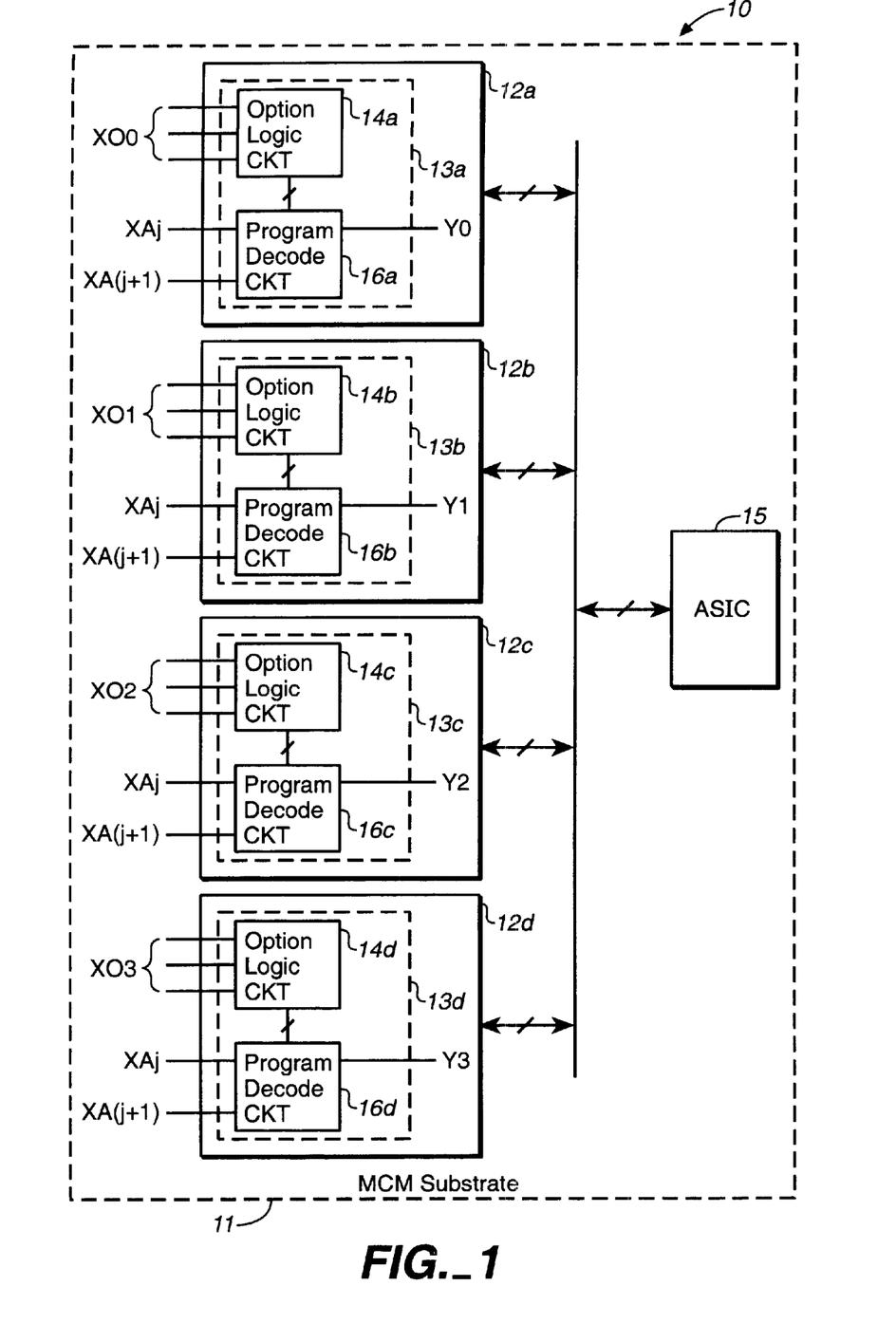
FIG. 1 illustrates an integrated circuit device, according to an embodiment of the present invention.

FIG. 1 illustrates an integrated circuit device 10, according to an embodiment of the present invention. Integrated circuit device 10 may be contained in a single protective package (e.g., plastic, ceramic, micro-ball grid array (MBGA), or chip scale package (CSP)) with suitable leads or other connecting points extending therefrom (not shown). As depicted, integrated circuit device 10 may comprise a multi-chip module (MCM) substrate 11 having multiple semiconductor dies or "chips" 12 of the same type attached thereto. It should be understood, however, that the present invention is not limited to this particular context, but may have broader applicability. MCM substrate 11 may have bonding pads (not expressly shown) for conveying signals into and out of integrated circuit device 10.

Semiconductor chips 12 are separately labeled 12a, 12b, 12c, and 12d. Although four chips 12 are depicted for this embodiment, it should be understood that more or less chips 12 may be present in other embodiments. Each semiconductor chip 12 can be implemented as a separate monolithic, semiconductor die. In one embodiment, for example, each semiconductor chip 12 can be an integrated circuit memory chip including dynamic random access memory (DRAM), static random access memory (SRAM), non-volatile random access memory (NVRAM), and read only memory (ROM), such as erasable programmable ROM (EPROM), electrically erasable programmable ROM (EEPROM), and flash memory. In another embodiment, each semiconductor chip 12 can be a logic chip or device such as, for example, a field programmable gate array (FPGA), programmable logic device (PLD), complex programmable logic device (CPLD), or other logic device.

Each semiconductor chip 12 may include a plurality of functional elements for performing memory functions, logic functions, or any other suitable functions. In one embodiment, the functional elements on the various semiconductor chips 12 can be separately addressable. Functional elements for memory chips can be individual memory cells, blocks of memory cells, or arrays of memory cells. Functional elements for a logic device can be addressable logic function blocks.

The semiconductor chips 12 are attached to MCM substrate 11, and may be electrically connected to bonding pads on the MCM substrate 11. Semiconductor chips 12 may exchange data and information with other electronic components internal to integrated circuit device 10. For example, semiconductor chips 12 may communicate with an application specific integrated circuit (ASIC) 15, which can also be attached to MCM substrate 11. Furthermore, semiconductor chips 12 may exchange data and information with electronic components connected and external to integrated circuit device 10. Such an external component can be, for example, a separately packaged microprocessor. In some situations, the data/information exchanged with semiconductor chips 12 may be desirably directed, transferred, or communicated to or obtained from a particular one of the semiconductor chips 12.

According to an embodiment of the present invention, a separate configurable addressing circuit 13 is provided on each semiconductor chip 12 so that the individual chips 12 can be accessed via addressing signals, rather than with a chip select signal. In one embodiment, configurable addressing circuits 13 provide an option, which may or may not be enabled, for accessing the respective chips 12. Configurable addressing circuits 13 are separately labeled 13a, 13b, 13c, and 13d, and may each be connected to one or more bonding pads on MCM substrate 11. With configurable addressing circuits 13, addressing signals may be used to identify or specify a particular semiconductor chip 12 with which to communicate for the transfer or exchange of data and information. That is, address signals in a normal address path common to at least a portion, up to all, of semiconductor chips 12 are used to select individual chips 12. This is advantageous in that an electronic component interacting with integrated circuit device 10 is not required to know with which semiconductor chip 12 it needs to communicate for inputting or extracting data/information. Nor is such an external electronic component required to support one or more chip select signals to specifically identify a particular semiconductor chip 12 in integrated circuit device 10.

Furthermore, configurable addressing circuits 13 allow the functional elements on all chips 12 to be presented as a uniform block of elements (e.g., logic or memory) which can be interfaced via a single set of addressing signals. This provides flexibility in implementation at the package level— i.e., more or less chips 12 can be used in integrated circuit device 10 depending on the functional capability desired. Configurable addressing circuits 13 can thus be used to provide a perceived increase in functional capability (e.g., four times more memory capacity) using a multiple of chips 12, but without requiring a user of integrated circuit device 10 to provide or support a chip select signal.

Each configurable addressing circuit 13 can be configured so that the respective chip 12 on which the circuit 13 is contained responds to a particular range of addresses which may appear on the common address path. This configuration can be accomplished via a bonding option, a fuse option, an anti-fuse option, programming, or any other suitable mechanism for configuration. Actions for configuring configurable addressing circuit 13 are represented symbolically by XO0, XO1, XO2, and XO3 in FIG. 1. Each configuration action XO0, XO1, XO2, and XO3 comprises one or more actions for configuring a respective configurable addressing circuit 13 to be accessed by a particular range of addresses. In one embodiment, each programming action XO0, XO1, XO2, or XO3 includes a respective first and second selection actions XOPTS0, XOPTS1 and a respective enabling action XOPTE. For a bonding option, a configuration action can be bonding a pad on a chip 12 to either ground (GND) or a voltage supply (VDD). For a fuse option, a configuration action can be blowing a fuse. For an anti-fuse option, a configuration action can be programming an anti-fuse. For a programming option, a configuration action can be providing a programming signal, for example, via ASIC 15.

Each configurable addressing circuit 13 may receive address signals XAj, XA(j+1). The address signals XAj, XA(j+1) can be a part of a group of address signals XA0–XAn which are used for accessing elements (e.g., logic or memory) contained in any of the semiconductor chips 12. Address signals XA0–XAn appear on a normal address path common to all chips 12. Address signals XAj, XA(j+1) may represent the most significant bits (MSB), the least significant bits (LSB), or any other bits of address signals XA0–XAn. A particular combination of values for address signals XAj, XA(j+1) essentially function to address a particular chip 12 to the exclusion of addressing the other chips 12. Address signals XAj, XA(j+1) can be generated external to chips 12 and input to chips 12 via one or more bonding pads. Each configurable addressing circuit 13 can be configured with respective selection actions XOPTS0, XOPTS1 so that the respective chip 12 is addressed by a particular combination of values for address signals XAj, XA(j+1). Enable action XOPTE enables the configurable addressing circuit 13 on the respective semiconductor chip 12. If configurable addressing circuit 13 is enabled, then the respective chip 12 "sees" the address bits provided by address signals XAj, XA(j+1) and may generate a respective internal selection signal (Y0, Y1, Y2, or Y3) for the chip in response to an address which falls within the range for which that chip 12 is configured. If the configurable addressing circuit 13 is not enabled on a particular chip 12, then the chip will ignore the address bits provided by address signals XAj, XA(j+1).

An embodiment of one scheme for the configuration actions and addressing signals for chips 12 (in which configuration addressing circuits 13 are implemented as bonding options) is provided in the following Table 1:

TABLE 1

| Chip Addressed | Value of XA(j + 1) | Value of XAj | Bonding for XOPTE | Bonding for XOPTS1 | Bonding for XOPTS0 |
|---|---|---|---|---|---|
| Chip 0 | 0 | 0 | GND | NB | NB |
| Chip 1 | 0 | 1 | GND | NB | GND |
| Chip 2 | 1 | 0 | GND | GND | NB |
| Chip 3 | 1 | 1 | GND | GND | GND |

In Table 1, "GND" indicates bonding to ground, and "NB" indicates "not bonded." Alternatively, instead of being "not bonded," bonding could be to VDD. Each option logic circuit 14 may output one or more configuration signals.

The addressing scheme provided in Table 1 can support an integrated circuit device 10 having three or four chips 12. It should be understood, however, that in general the number of addressing signals used for addressing the different chips 12 in integrated circuit device 10 depends on the number of chips provided. For example, in other embodiments, if integrated circuit device 10 contains only two chips 12, then a single addressing signal is sufficient; if integrated circuit device 10 contains from five to eight chips 12, then three addressing signals are needed; if integrated circuit device contains from nine to sixteen chips, then four addressing signals are needed; and so on.

As depicted, for each semiconductor chip 12, configurable addressing circuit 13 comprises an option logic circuit 14 (separately labeled 14a, 14b, 14c, and 14d) and a configuration decode circuit 16 (separately labeled 16a, 16b, 16c, and 16d).

Each option logic circuit 14 can be configured with one or more respective configuration actions XOPST0, XOPTS1, so that the respective semiconductor chip 12 responds to a particular range of addresses. These addresses may be provided to integrated circuit device 10 via addressing signals, which may include address signals XAj and XA(j+1). Option logic circuits 14 can be implemented as bonding options, fuse options, anti-fuse options, software programmed, or any other suitable implementation. Each option logic circuit 14 may generate one or more configuration signals.

Each configuration decode circuit 16 is coupled to or in communication with the option logic circuit 14 on the same semiconductor chip 12 and receives the configuration signals therefrom. The configuration signals cause the configuration decode circuit 16 to be responsive to the respective range of addresses. Thus, if an address conveyed at least in part by the address signals XAj, XA(j+1) falls within the particular range of addresses for which the respective configurable addressing circuit 13 has been configured, the configuration decode circuit 16 generates a respective internal selection signal (Y0, Y1, Y2, or Y3) for the semiconductor chip 12 on which it is incorporated.

In practice, the configurable addressing circuit 13 on each semiconductor chip 12 may be configured to respond to a respective range of addresses. This is accomplished by performing respective configuration actions XOPTS0, XOPTS1, XOPTE to the option logic circuit 14 on each respective chip 12. Each option logic circuit 14 may then generate one or more configuration signals which are provided to the respective configuration decode circuit 16. After configuration, integrated circuit device 10 may be used in normal operating mode. During the normal operating mode, address signals XA0–XAn (including XAj, XA(j+1)) are provided in a normal address path common to at least a portion of chips 12 to address various elements (e.g., logic or memory) in integrated circuit device 10. These elements may be part of one or more of chips 12. The configuration decode circuits 16 on all chips 12 in integrated circuit device 10 receive these address signals XA0–XAn. If the address signals are conveying an address which falls within the range for which a particular configurable addressing circuit 13 has been configured, the respective configuration decode circuit 16 will output a respective internal selection signal Y0, Y1, Y2, or Y3 for the particular chip 12. This causes the chip 12 to be accessible, and thus data/information can be input into or retrieved from one or more elements on the chip 12.

Addressing View

Figure 2:
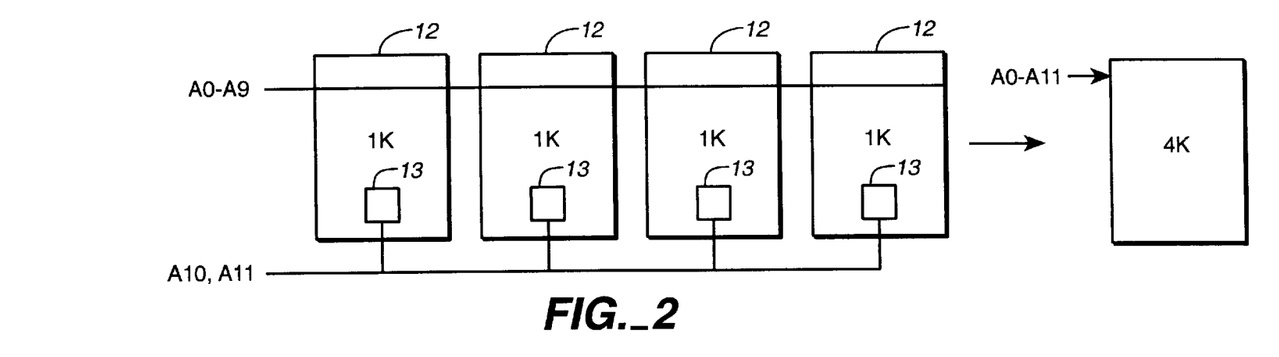
FIG. 2 illustrates how multiple chips within a package can be viewed as a single chip with application of the present invention.

FIG. 2 illustrates how multiple chips within a package can be viewed as a single chip with application of the present invention. With configurable addressing circuits 13, chips 12 in integrated circuit device can be treated as a uniform block of functional elements which are accessed with a set of addressing signals XA0–XAn (of which XAj, XA(j+1) may be part) and without the need for external chip select signals. As depicted, if each chip 12 comprises 1K of memory which is addressable by ten address bits A0–A9, then four chips 12 provide 4K of memory which can be addressed with twelve address bits A0–A11. In this example, addressing signals XAj, XA(j+1) may convey address bits A10, A11, respectively. Any electronic component interacting with the four chips 12, each with 1K of memory capacity, should support address signals for a twelve-bit address, but does not need to support, provide or generate a separate chip select signal.

Option Logic Circuit

Figure 3A:
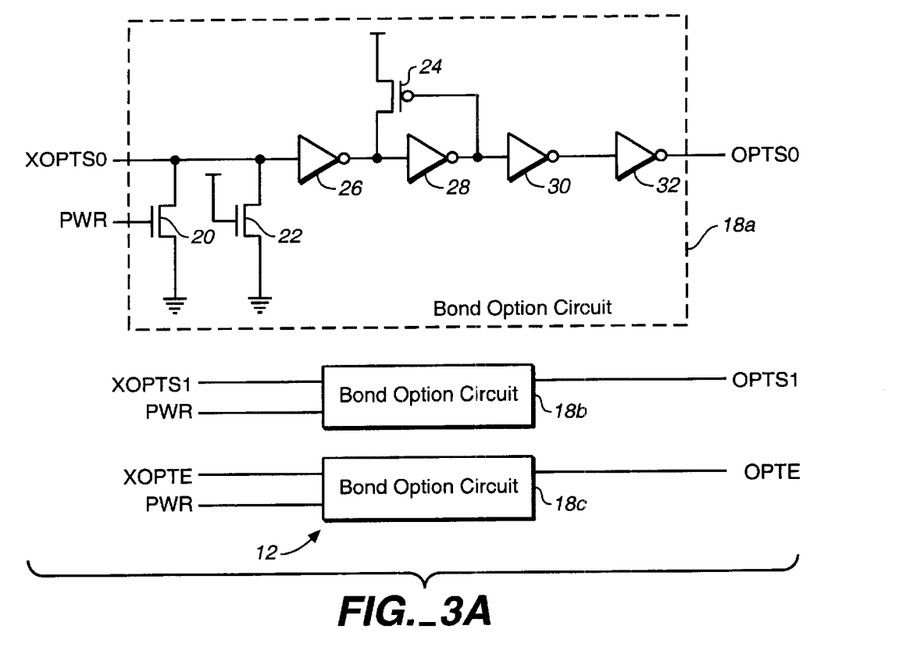
FIG. 3A is a schematic diagram in partial block form for an implementation of an option logic circuit, according to an embodiment of the present invention.

FIG. 3A illustrates a schematic diagram in partial block form for an implementation of an option logic circuit 14, according to an embodiment of the present invention.

Option logic circuit 14 can be incorporated on a semiconductor chip 12 and may be coupled to or in communication with a respective configuration decode circuit 16 on the same chip. As depicted, option logic circuit 14 comprises a number of bond option circuits 18 (separately labeled 18a, 18b, and 18c).

Each bond option circuit 18 generally functions to implement a bonding option for the semiconductor chip 12 on which bond option circuit 18 is incorporated. A bond option circuit 18 may be bonded out via a respective configuration action XOPTx to produce a respective internal configuration action signal OPTx in response. As depicted, in one embodiment, the configuration actions can include selection actions XOPTS0, XOPTS1 and an enable action XOPTE. The selection actions XOPTS0, XOPTS1 configure the respective semiconductor chip 12 to respond to a particular range of addresses. The enable action XOPTE enables the use of configurable addressing circuit 13 on the respective chip 12.

Figure 3B:
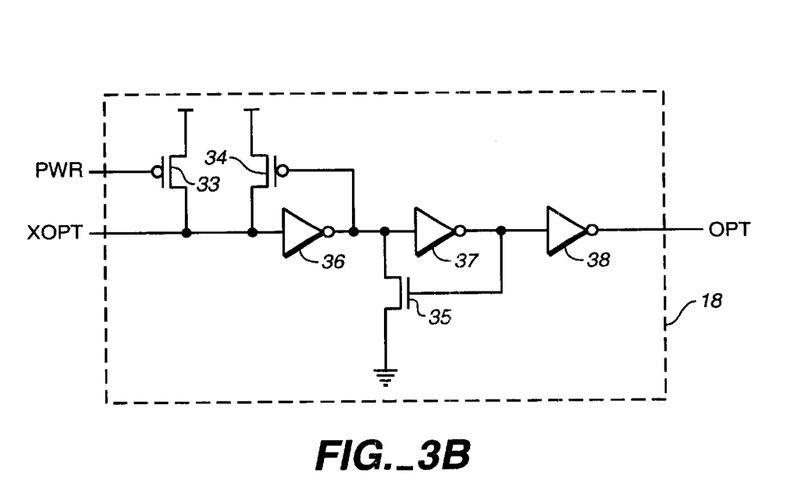
FIG. 3B is a schematic diagram for an alternate implementation of a bond option circuit.

FIG. 3B provides a detailed exemplifying schematic implementation for bond option circuit 18a, but it should be understood that the other bond option circuits 18b and 18c can be implemented in substantially the same way. Referring to the detailed implementation for bond option circuit 18a, in one embodiment, each bond option circuit 18 may comprise transistors 20, 22, 24, and inverter gates 26, 28, 30, 32. Transistors 20 and 22 can be N-type transistors with drains coupled to an input terminal for bond option circuit 18. The input terminal is attached to a bonding pad (which can be bonded to ground, voltage supply, or left unbonded, depending on the respective configuration action XOPTS0, XOPTS1, or XOPTE). The source of each transistor 20 and 22 is coupled to ground. The gate of transistor 20 receives power PWR, and the gate of transistor 22 is coupled to VDD.

Inverter gates 26, 28, 30, and 32 are coupled in series or cascade arrangement from the input terminal. Transistor 24 can be a P-type transistor having a source coupled to VDD, a drain coupled to the output terminal of inverter gate 26 (which is also the input terminal for inverter gate 28). The gate of transistor 24 is coupled to the output terminal of inverter gate 28 (which is also the input terminal for inverter gate 30). The output of bond option circuit 18 (which may be configuration signal OPTS0, OPTS1, or OPTE) appears at the output terminal.

It should be understood that the relationships between the configuration actions and the configuration signals described with reference to the embodiments depicted herein are arbitrary; in other embodiments, the relationships could be different. Furthermore, it should be understood that in other embodiments, rather than being implemented as a bonding option, option logic circuit 14 can be implemented as a fuse option, an anti-fuse option, a programming option, or any other suitable implementation. For a programming option, programming can be accomplished via an ASIC, such as, for example, ASIC 14 shown in FIG. 1.

In operation, input terminal of bond option circuit 18 is bonded out to ground or a supply voltage (or left unbonded). Power may be applied at the gate terminal of transistor 20. If the input terminal of bond option circuit 18 is bonded to supply voltage, a high value appears at the input terminal. This propagates through the inverter gates 26, 28, 30, and 32 so that the value of the signal output by inverter gate 32 is a high. The high value output by inverter gate 32 is output from bond option circuit 18 as the value for the respective configuration signal. Alternatively, if the input terminal of bond option circuit 18 is bonded to ground, a low signal appears at the input terminal. This propagates through bond option circuit 18 so that the value of the signal output by inverter gate 32 is low. This low value is output from bond option circuit 18 as the value for the respective configuration signal. The configuration signal for bond option circuit 18 is provided to a respective configuration decode circuit 16 so that the circuit 16 may respond to a particular range of addresses.

FIG. 3B is a schematic diagram for an alternate implementation of a bond option circuit 18. In this embodiment, as depicted, bond option circuit 18 may comprise transistors 33, 34, and 35 and inverter gates 36, 37, and 38. Each of transistors 33 and 34 can be P-type transistors with sources coupled to VDD and drains coupled to an input terminal for circuit 18. The gate of transistor 33 receives power PWR and the gate of transistor 34 is connected to the output of inverter gate 36. Inverter gates 36, 37, and 38 are connected in cascade arrangement. Transistor 35 can be an N-type transistor. The drain of transistor 35 is coupled to the output of inverter gate 36, and the source is connected to ground GND. The gate of transistor 35 is connected to the output of inverter gate 37. The output of inverter gate 38 constitutes the output for bond option circuit 18 in this embodiment.

Configuration Decode Circuit

Figure 4:
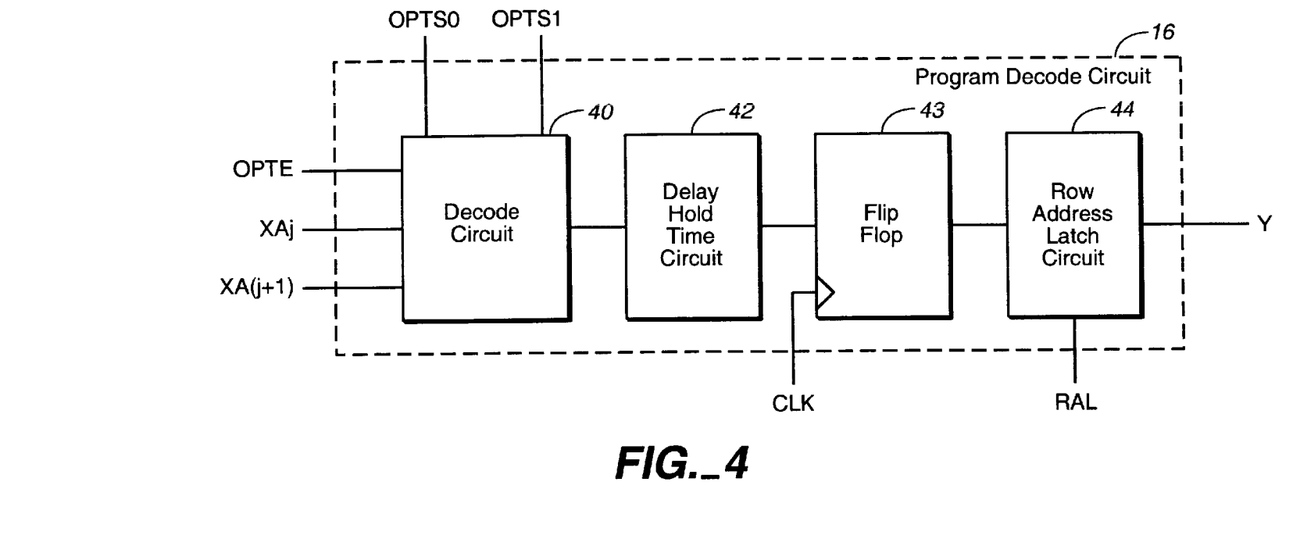
FIG. 4 is a schematic block diagram for an implementation of a configuration decode circuit, according to an embodiment of the present invention.

FIG. 4 is a schematic block diagram for an implementation of configuration decode circuit 16, according to an embodiment of the present invention. Configuration decode circuit 16 may be incorporated on a semiconductor chip 12 and coupled to or in communication with a respective option logic circuit 14. When the configurable addressing circuit 13 is enabled and bonded, configuration decode circuit 16 responds to a particular range of addresses conveyed by one or more external address signals XA0–XAn. As depicted, configuration decode circuit 16 includes a decode circuit 40, a delay hold time circuit 42, a flip flop 43, and a row address latch circuit 44.

Decode circuit 40 receives configuration signals OPTS0, OPTS1, and OPTE which are generated by the respective option logic circuit 14. Decode circuit 40 also receives the externally generated address signals XAj, XA(j+1). Decode circuit 40 generally functions to decode the various configuration signals OPTS0, OPTS1, and OPTE and address signals XAj, XA(j+1) to determine whether the chip 12 on which configuration decode circuit 16 is incorporated should be accessed in response. Decode circuit 40 outputs an internal selection signal SELECT.

Delay hold time circuit 42 is coupled to or in communication with decode circuit 40, and receives the address ADDR signal therefrom. Delay hold time circuit 42 generally functions to delay the internal selection signal.

Flip flop 43 is coupled to or in communication with delay hold time circuit 42. Flip flop 43 can be a D flip flop. Flip flop 43 receives the delayed internal selection signal from delay hold time circuit 42. Flip flop 43 also receives a clock CLK signal. When the CLK signal goes high, flip flop 43 passes the delayed internal selection signal.

Row address latch circuit 44 is coupled to or in communication with flip flop 43, and receives the delayed selection signal. Row address latch circuit 44 also receives a row address latch signal RAL. Row address latch circuit 44 generally functions to latch the internal selection signal so that it can be used for addressing elements within the chip 12.

Decode Circuit

Figure 5:
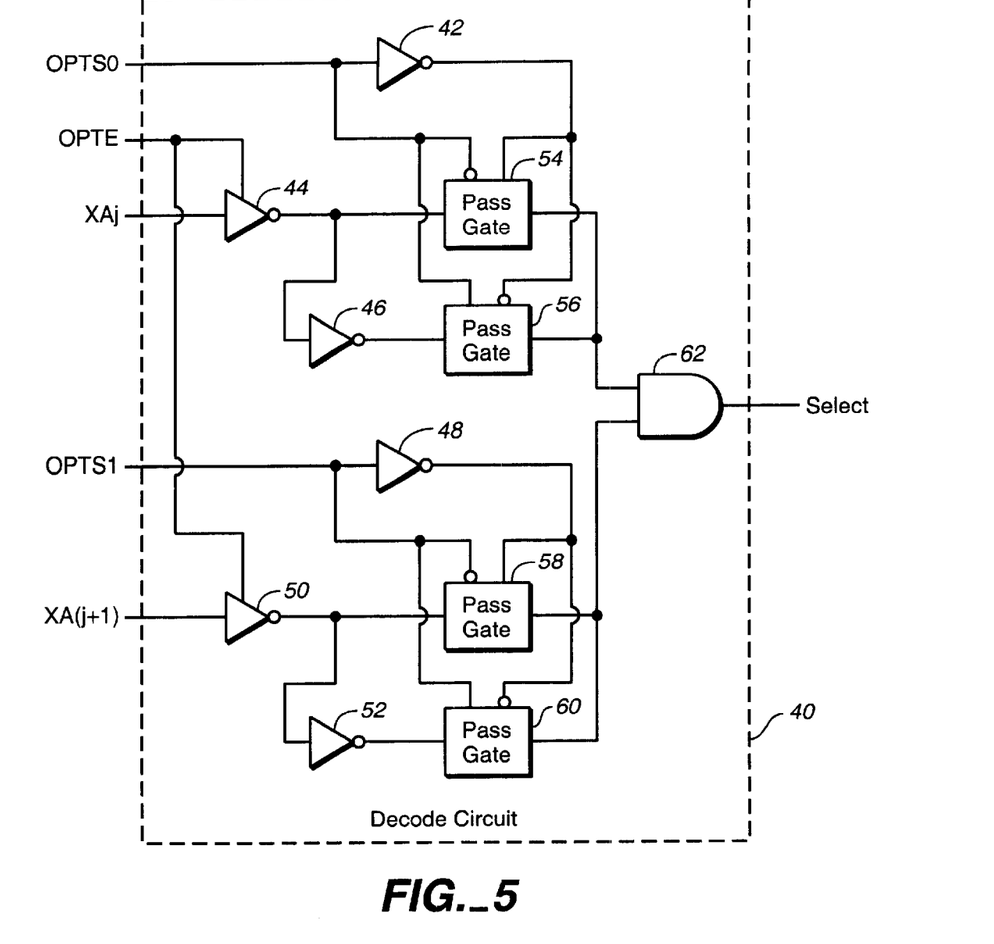
FIG. 5 is a schematic diagram for an implementation of a decode circuit, according to an embodiment of the present invention.

FIG. 5 is a schematic diagram for an implementation of decode circuit 40, according to an embodiment of the present invention. In general, decode circuit 40 functions to generate an internal selection signal SELECT for selecting the chip 12 on which it is incorporated depending on how configurable addressing circuit 13 has been configured to respond to externally generated address signals XAj, XA(j+1). Configuration is achieved with configuration signals OPTS0, OPTS1 generated by a respective option logic circuit 14. The values of configuration signals OPTS0, OPTS1 depend on the configuration (e.g., bonding) options chosen. Decode circuit 40 will output a value for internal selection signal SELECT indicating that the semiconductor chip 12 has been addressed depending on the particular combination of values for OPTS0, OPTS1, OPTE, XAj, and XA(j+1). It should be understood that the relationship described herein between the externally generated address signals and the configuration signals is arbitrary, and in other embodiments, could be different. As shown, in one embodiment, decode circuit 40 comprises inverter gates 42, 46, 48, 52, buffers 44, 50, pass gates 54, 56, 58, 60, and an AND gate 62.

Inverter gate 42 receives configuration signal OPTS0 at its input terminal. Pass gate 54 is enabled by the inverse of the configuration signal OPTS0 and the output signal from inverter gate 42. Buffer 44 is enabled by the configuration signal OPTE and receives the externally generated address signal XAj at its input terminal. The output signal from buffer 44 is applied at the input terminal of pass gate 54 and the input terminal of inverter gate 46. Pass gate 56 is enabled by the configuration signal OPTS0 and the inverse of the output signal from inverter gate 42. The output signal from inverter gate 46 is applied to the input terminal of pass gate 56. Depending on the value of configuration signal OPTS0, the value of external address signal XAj, or its inverse, will be passed by pass gate 54 or 56 to one input terminal of AND gate 62.

Inverter gates 48, 52, buffer 50, and pass gates 58, 60—which are coupled in an arrangement similar to that for inverter gates 42, 46, buffer 44, and pass gates 54, 56—operate in substantially the same manner so that the value of external address signal XA(j+1), or its inverse, is input to the other input terminal of AND gate 62 depending on the value of configuration signal OPTS1. AND gate 62 outputs the internal selection signal SELECT. The internal selection signal SELECT may cause the respective semiconductor chip 12 to be accessible.

Pass Gate

Figure 6:
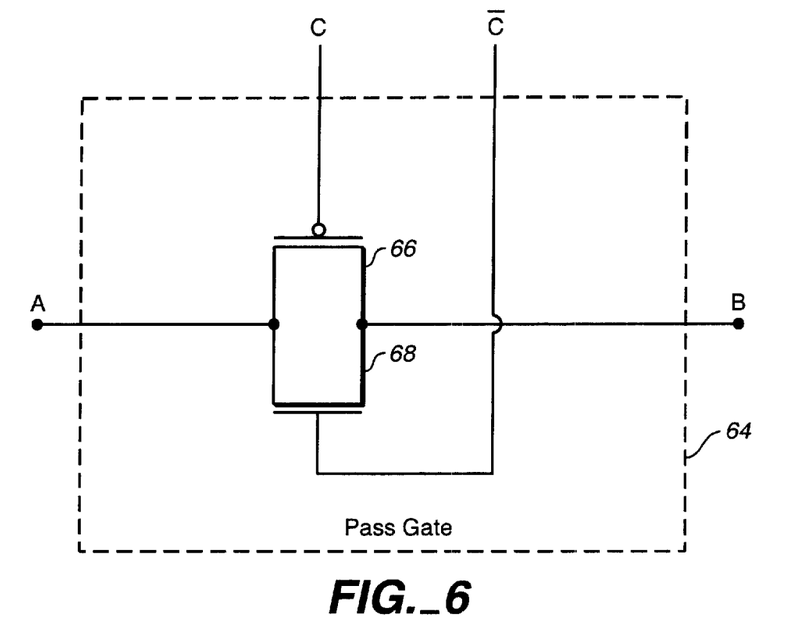
FIG. 6 is a schematic diagram for an implementation of a pass gate.

FIG. 6 illustrates an exemplary implementation for pass gate 64 which can be any of the pass gates described herein (e.g., pass gates 54, 56, 58, and 60 shown in FIG. 4). As shown, pass gate 64 comprises a P-type transistor 66 and an N-type transistor 68 with their sources and drains coupled together. An enable signal C is applied to the gate of transistor 66, and the inverse of the enable signal C is applied to the gate of transistor 68. An input terminal of pass gate 64 receives a signal A, and a signal B appears at an output terminal for pass gate 64. In operation, when the value of the enable C is low (and, consequently, the value of the inverse of the enable signal is high), the value of the input signal A is passed through pass gate 64 as the value of signal B.

Delay Hold Time Circuit

Figure 7:
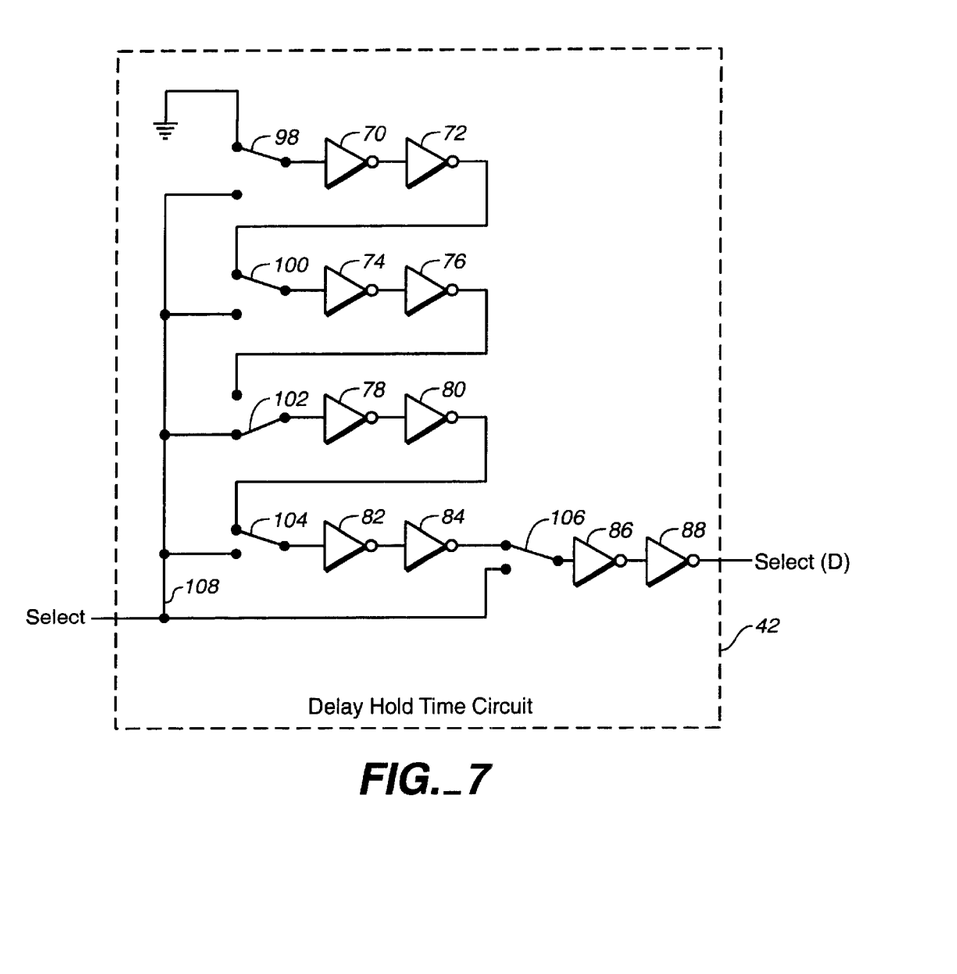
FIG. 7 is a schematic diagram for an implementation of delay hold time circuit, according to an embodiment of the present invention.

FIG. 7 is a schematic diagram for an implementation of delay hold time circuit 42, according to an embodiment of the present invention. Delay hold time circuit 42 generally functions to delay the internal selection signal SELECT for a predetermined amount of time. In one embodiment, this predetermined amount of time is programmable. As depicted, delay hold time circuit 42 includes inverter gates 70, 72, 74, 76, 78, 80, 82, 84, 86, 88, and switches 98, 100, 102, 104, and 106.

The internal selection signal SELECT is applied at an input terminal or node 108. Inverter gates 70, 72, 74, 76, 78, 80, 82, 84 are coupled in pairs. These pairs include inverter gates 70, 72, inverter gates 74, 76, inverter gates 78, 80, and inverter gates 82, 84. The pairs of inverter gates may be programmably coupled in series, using respective switches 98, 100, 102, 104, to provide an adjustable delay for the propagation of the internal selection signal SELECT from node 108 through delay hold time circuit 42. In particular, each pair of inverter gates is associated with a respective switch 98, 100, 102, or 104 which functions to connect or add the pair of inverter gates to a delay chain, which delays the propagation of the internal selection signal SELECT. Switches 98, 100, 102, and 104 couple the respective inverter gate pairs to either node 108 or a preceding pair of inverter gates, thereby increasing or decreasing the length of the delay chain. That is, the inverter gate pairs are added to or taken out of the delay chain by respective switches 98, 100, 102, and 104. The inclusion of more inverter gate pairs into the delay chain will increase the amount of time by which internal selection signal SELECT is delayed when propagating through circuit 42. If more inverter gates are added to the delay chain, there will be a longer delay for the propagation of the internal selection signal SELECT. If less inverter gates are added to the delay chain, there will be a shorter delay for the propagation of the internal selection signal SELECT. As depicted, only two inverter gate pairs (which include inverter gates 78, 80, 82, and 84) are part of the delay chain.

As an alternative, if it is desired to minimize the delay for the internal selection signal SELECT, then input terminal 108 may be coupled by switch 106 to the next portion of delay hold time circuit 42, thereby effectively not using any of the delay chain which can be formed from inverter gates 70, 72, 74, 76, 78, 80, 82, 84.

This next portion of circuit 42 comprises inverter gates 86 and 88, which are connected in series. The output of the inverter gate 88 comprises the output for delay hold time circuit 42, which is a delayed selection signal SELECT(D).

Row Address Latch Circuit

Figure 8:
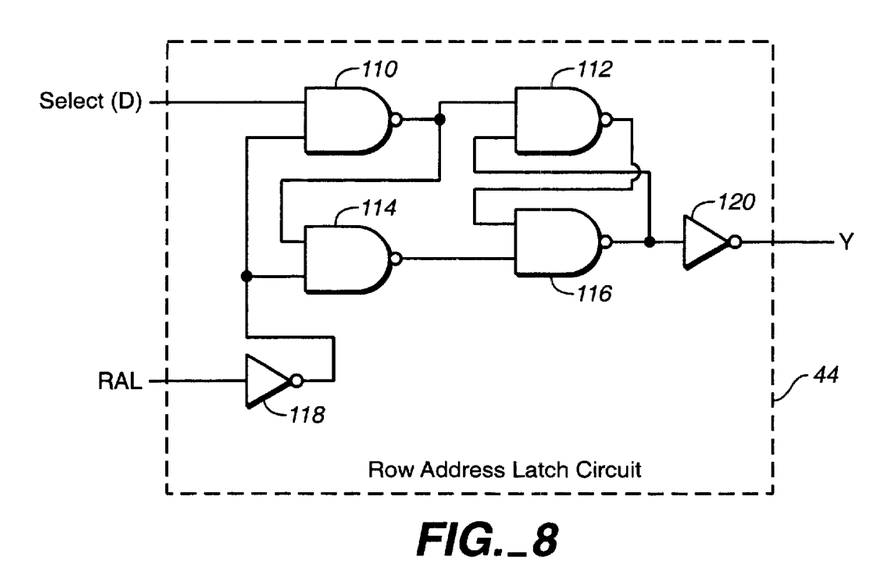
FIG. 8 is a schematic diagram for an implementation of row address latch circuit, according to an embodiment of the present invention.

FIG. 8 is a schematic diagram of an implementation for row address latch circuit 44, according to an embodiment of the present invention. Row address latch circuit 44 may be incorporated on a semiconductor chip 12 as part of configuration decode circuit 16. Row address latch circuit 44 can be coupled to or in communication with a respective flip flop 43, which may also be part of the same configuration decode circuit 16. In general, row address latch circuit 44 functions to latch the delayed selection signal SELECT(D) so that it can be used for accessing elements in the respective chip 12. As depicted, row address latch circuit 44 comprises NAND gates 110, 112, 114 116, and inverter gates 118, 120.

Inverter gate 118 receives the row address latch signal RAL at its input terminal. The output signal from inverter gate 118 is provided to one input terminal for each of NAND gates 110 and 114. Another input terminal of NAND gate 110 receives the delayed selection signal SELECT(D) from the respective delay hold time circuit 42. Another input terminal of NAND gate 114 receives the output signal from NAND gate 110. One input terminal of NAND gate 112 receives the output signal from NAND gate 110. Another input terminal of NAND gate 112 receives the output signal from NAND gate 116. One input terminal of NAND gate 116 receives the output signal from NAND gate 114, and the other input terminal of NAND gate 116 receives the output from NAND gate 112. With this arrangement, NAND gates 110, 112, 114, and 116 operate as a latch circuit. When the row address latch signal RAL has a high value, the value of the internal selection signal SELECT from the respective flip flop 43 is latched.

Inverter gate 120 receives the output from NAND gate 116 at its input terminal. Inverter gate 120 outputs the internal selection signal SELECT. This signal is then placed into the common address path for use in accessing a particular element (e.g., logic or memory) in the semiconductor chip 12 on which the row address latch circuit 44 is incorporated. For example, in one embodiment, the internal selection signal SELECT may be generated as part of the logic for generating a row address enable signal, which is applied to the pre-decoders.

With embodiments of the present invention, a user of an integrated circuit device having multiple chips of the same type contained within a single package is not required to specifically select from one of the chips during normal operation. Rather, similar elements (e.g., logic or memory) contained in the various chips appear to the user as a uniform block of elements which can be accessed with addressing signals provided in a normal address path common to all chips. The user is not required to provide and support chip select signals, nor to keep track of what information/data should be stored or retrieved from each chip. This facilitates operation and coding on the part of a user. Furthermore, an electronic component interacting with the integrated circuit device is not required to know with which semiconductor chip it needs to communicate for inputting or extracting data/information. Nor is such an external electronic component required to generate or support one or more chip select signals to specifically identify a particular semiconductor chip in the integrated circuit device.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A first semiconductor chip operable to be incorporated along with at least a second semiconductor chip of the same type into an integrated circuit device within a single package, the integrated circuit device having a common address path for the first and second semiconductor chips, the first semiconductor chip comprising:

an option logic circuit operable to generate a configuration signal for causing an address decode circuit to respond to a predetermined range of addresses conveyed in the common address path of the integrated circuit device; and the address decode circuit in communication with the option logic circuit, the address decode circuit operable to decode an address conveyed in the common address path of the integrated circuit device using the configuration signal and to generate a selection signal for selecting the first semiconductor chip if the address falls within the predetermined range of addresses, thereby enabling the first semiconductor chip to be selected in the integrated circuit device within the single package.

2. The first semiconductor chip of claim 1, wherein the option logic circuit is implemented as at least one of a bond option, a fuse option, an anti-fuse option, or a programming option.

3. The first semiconductor chip of claim 1, wherein the address decode circuit is operable to latch the selection signal.

4. The first semiconductor chip of claim 3, wherein latching is in response to a row address latch signal.

5. The first semiconductor chip of claim 1, wherein the first and the second semiconductor chips each comprise a memory chip.

6. The first semiconductor chip of claim 1, wherein the first and the second semiconductor chips each comprise a logic chip.

7. A method for configurable addressing of a first semiconductor chip incorporated along with at least a second semiconductor chip of the same type into an integrated circuit device within a single package, the integrated circuit device having a common address path for the first and second semiconductor chips, the method comprising:
   generating a configuration signal for causing the first semiconductor chip to respond to a predetermined range of addresses conveyed in the common address path of the integrated circuit device; and
   generating a selection signal for selecting the first semiconductor chip if an address conveyed in the common address path of the integrated circuit device falls within the predetermined range of addresses, thereby enabling the first semiconductor chip to be selected in the integrated circuit device within the single package.

8. The method of claim 7, wherein generating a configuration signal comprises bonding an option logic circuit on the first semiconductor chip.

9. The method of claim 7, wherein generating a configuration signal comprises blowing a fuse of an option logic circuit on the first semiconductor chip.

10. The method of claim 7, wherein generating a configuration signal comprises programming an antifuse of an option logic circuit on the first semiconductor chip.

11. The method of claim 7, wherein generating a configuration signal comprises programming an option logic circuit on the first semiconductor chip.

12. The method of claim 7, wherein generating a configuration signal comprises enabling an option logic circuit on the first semiconductor chip.

13. The method of claim 7, further comprising latching the selection signal.

14. The method of claim 7, wherein generating a selection signal comprises decoding the address using the configuration signal.

15. An integrated circuit device within a single package having a common address path, the integrated circuit device comprising:
   a multi-chip module substrate; and
   a plurality of semiconductor chips of the same type attached to the multi-chip module substrate, wherein each semiconductor chip comprises a respective configurable addressing circuit for causing the semiconductor chip to respond to a respective predetermined range of addresses, wherein each semiconductor chip is selected by an address conveyed in the common address path of the integrated circuit device if the address falls within the respective predetermined range of addresses for that semiconductor chip, thereby allowing any of the semiconductor chips to be selected in the integrated circuit device within the single package.

16. The integrated circuit device of claim 15, wherein each configurable addressing circuit is implemented as at least one of a bond option, a fuse option, an anti-fuse option, or a programming option.

17. The integrated circuit device of claim 15, wherein each semiconductor chip comprises a memory chip.

18. The integrated circuit device of claim 15, wherein each semiconductor chip comprises a logic chip.

19. The integrated circuit device of claim 15, wherein each configurable addressing circuit comprises a respective option logic circuit operable to be configured for causing the respective semiconductor chip to respond to the respective predetermined range of addresses.

20. The integrated circuit device of claim 15, wherein each configurable addressing circuit comprises a respective address decode circuit operable to select the respective semiconductor chip if an address conveyed in the common address path of the integrated circuit device falls within the respective predetermined range of addresses.

21. An integrated circuit device within a single package comprising:
   a multi-chip module substrate;
   a plurality of semiconductor chips of the same type attached to the multi-chip module substrate; and
   a common address path for the plurality of semiconductor chips;
   wherein each semiconductor chip comprises:
      a respective plurality of functional elements, each functional element separately addressable by a respective address, and
      a respective configurable addressing circuit for causing the semiconductor chip to respond to any address within a respective predetermined range of addresses and without an external chip select signal, the respective predetermined range of addresses comprising the respective addresses for each functional element of the semiconductor chip, wherein said any address within the respective predetermined range of addresses is conveyed in the common address path of the integrated circuit device.

22. The integrated circuit device of claim 21, wherein each semiconductor chip comprises a memory chip.

23. The integrated circuit device of claim 21, wherein each semiconductor chip comprises a logic chip.

24. The integrated circuit device of claim 21, wherein each configurable addressing circuit is implemented as at least one of a bond option, a fuse option, an anti-fuse option, or a programming option.

25. An option logic circuit for a first semiconductor chip operable to be incorporated along with at least a second semiconductor chip of the same type into an integrated circuit device within a single package, the integrated circuit device having a common address path for the first and second semiconductor chips, the option logic circuit operable to be configured so that the first semiconductor chip responds to a predetermined range of addresses conveyed in the common address path of the integrated circuit device, the option logic circuit operable to generate a configuration signal for causing the first semiconductor chip to be selected in the integrated circuit device within the single package if an address conveyed in the common address path falls within the predetermined range of addresses.

26. The option logic circuit of claim 25, wherein the option logic circuit is implemented as a bond option.

27. The option logic circuit of claim 25, wherein the option logic circuit is implemented as a fuse option.

28. The option logic circuit of claim 25, wherein the option logic circuit is implemented as a an anti-fuse option.

29. The option logic circuit of claim 25, wherein the option logic circuit is implemented as a programming option.

30. A first semiconductor chip operable to be incorporated along with at least a second semiconductor chip of the same type into an integrated circuit device within a single package, the integrated circuit device having a common address path for the first and second semiconductor chips, the first semiconductor chip comprising:

- an option logic circuit operable to be configured for generating a configuration signal so that the first semiconductor chip responds to a predetermined range of addresses conveyed in the common address path of the integrated circuit device; and
- an address decode circuit in communication with the option logic circuit, the address decode circuit operable to decode an address conveyed in the common address path of the integrated circuit device using the configuration signal and to generate a selection signal for selecting the first semiconductor chip in the integrated circuit device within the single package if the address conveyed in the common address path falls within the predetermined range of addresses.

31. The first semiconductor chip of claim 30, wherein the option logic circuit is implemented as at least one of a bond option, a fuse option, an anti-fuse option, or a programming option.

32. A method for configurable addressing of a first semiconductor chip incorporated along with at least a second semiconductor chip of the same type into an integrated circuit device within a single package, the integrated circuit device having a common address path for the first and second semiconductor chips, the method comprising:

configuring the first semiconductor chip to respond to a predetermined range of addresses in the common address path of the integrated circuit device and without an external chip select signal;

decoding an address conveyed in the common address path of the integrated circuit device; and generating a selection signal if the address conveyed in the common address path falls within the predetermined range of addresses, thereby enabling the first semiconductor chip to be selected in the integrated circuit device within the single package.

* * * * *